United States Patent [19]

Spencer et al.

[11] Patent Number: 5,352,488
[45] Date of Patent: Oct. 4, 1994

[54] CHEMICAL VAPOR DEPOSITION PROCESS EMPLOYING METAL PENTADIENYL COMPLEXES

[75] Inventors: James T. Spencer, Syracuse, N.Y.; Richard D. Ernst, Salt Lake City, Utah

[73] Assignee: Syracuse University

[21] Appl. No.: 61,447

[22] Filed: May 14, 1993

[51] Int. Cl.$^5$ .............................................. C23C 16/00
[52] U.S. Cl. ..................................... 427/250; 427/252
[58] Field of Search ................................ 427/250, 252

[56] References Cited

PUBLICATIONS

Kirss, R. U., "Electrocyclic Reactions of Open Metallocenes: Carbon–Carbon Bond Formation during Thermolysis of Bis(2,4–dimethyl–1,3–pentadienyl) ruthenium and–osmium" Organometallics, 11(2) 1992, 497–499.

Stauf et al., "Patterned Photoassisted Organometallic Deposition of Iron, Nickel & Palladium On Silicon", 156 (1988) pp. L31–L36.

Ernst, Richard D., "Structural & Reactivity Patterns in Transition–Metal–Pentadienyl Chemistry", Chem. Rev. 1988, 88, 1255–1291.

*Primary Examiner*—Shrive Beck
*Assistant Examiner*—David M. Maiorana
*Attorney, Agent, or Firm*—Harris Beach & Wilcox

[57] ABSTRACT

Vapor deposition of metal films is carried out using as precursors metal compounds or complexes based on open pentadienyls and derivatives. The technique can be used favorably for transition metal depositions, and can be carried out photolytically or thermolytically. In certain cases, oxygen can be substituted for a terminal carbon atom.

13 Claims, No Drawings

CHEMICAL VAPOR DEPOSITION PROCESS EMPLOYING METAL PENTADIENYL COMPLEXES

This invention was developed under work connection with the following grants: NSF Grant CHE-8120683; NSF Grant No. CHE-8419271; NSF Grant CHE-8746895; and NSF Grant No. CHE-8914305. The government may have certain rights in the invention.

BACKGROUND OF THE INVENTION

This invention relates to the deposition of metal films, and in particular to chemical vapor deposition of transition metals such as Fe, Ni, Ti, V, Cr, Fe, Ru, Os, Zr, W, Mo, Hf and Nb, for example. The invention more particularly concerned with deposition processes where an organometallic precursor such as a metallocene is employed.

Chemical vapor deposition of metals by thermal decomposition of a metal cyclopentadienyl precursor is described, for example, in U.S. Pat. Nos. 4,880,670; 4,882,206; 4,915988 and 4,992,305.

Cyclopentadienyl involves a five-carbon ring, and can form a bond with certain metals and metalloids. Under high temperature conditions (600° C. to 1000° C.) These compounds will decompose to deposit a metal film. The remaining organic residues are carried away in the vapor flow, so there is only a minor incorporation of carbon in the deposited metal. Some of these cyclopentadienyl compounds are attractive as precursors because they have a significant vapor pressure (0.1 Torr) at temperatures on the order of 100° C., and are thermally stable over a generous range of temperatures.

Typically, these precursors are heated to produce vapor which is combined with a carrier gas entering a deposition chamber. The carrier gas and entrained organometallic vapor are flowed past a substrate. The substrate is heated to a suitable decomposition temperature so that the organometallic vapors decompose, leaving the metal film on the heated substrate. The decomposition temperature depends on the precursor used.

The metal cyclopentadienyl complexes employed in the techniques of the patents mentioned just above tend to have a higher than desired decomposition temperature in many cases, and are typically not subject to photolytic decomposition. This latter drawback makes laser writing of metal film patterns extremely difficult or impossible. Photo-assisted deposition, for selective area epitaxy, is also difficult or impossible with this technique. Precursors which involve cyclopentadienyl complexes are available for only a limited number of transition metals.

On the other hand, it is frequently desirable or necessary to carry out chemical vapor deposition at a lower temperature than can be used with this technique, to employ photolytic techniques, or to lay down a binary metal layer (more than one metallic element). It is desirable to have the flexibility of selecting among a wide range of metallic films without significantly modifying the deposition methodology involved. It is also desirable for the organometallic precursors to be stable and handleable materials, i.e., with low toxicity and minimal associated environmental problems.

OBJECTS AND SUMMARY OF THE INVENTION

Accordingly, it is an object of this invention to provide a chemical vapor deposition technique that overcomes the drawbacks of prior techniques.

It is another object to provide a technique that can form metal films on temperature sensitive substrates, by operating at relatively lower deposition temperatures.

It is a further object to provide a wide range of suitable organometallic precursors which provide access to many metallic films without significant modification of deposition methodology from one metallic element to another.

It is a still further object to provide a deposition technique employing chemicals that are stable, safe, and environmentally gentle.

It is a yet further object to provide a deposition technique that can be carried out photolytically, i.e., with a focused laser beam.

According to an aspect of this invention, the deposition process employs as precursors compounds in which metals are attached to organic pentadienyl groups. These are open pentadienyls in which the 1 and 5 carbons are not joined to one another. These compounds are sublimed and carried past a surface of interest on a substrate. The metal is then dissociated from the organic material as the result of either thermal or photochemical decomposition, and the metal is then deposited on the surface.

These compounds have optimal thermal stability and reactivity. Open pentadienyl compounds can be formed of many different metals, e.g., Ti, Zr, V, Fe, Ru and Os, which compounds are stable at room temperature but readily decompose at elevated temperatures or photolytically.

The class of organometallic species which can be referred to generally as open pentadienyl metal complexes serves as excellent source materials for the formation of metallic thin films either by thermolytic or photo-assisted processes. The precursor materials have the general formula

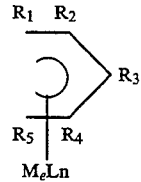

where $M_e$ is a metallic element and $L_n$ represents one or more ligands, which can be, e.g. carbonyl, phosphine, or another neutral donor ligand. The ligand can be another open pentadienyl. A suitable group, such as methyl, ethyl or another lower alkyl, silyl or alkylated silyl, or a halogenated lower alkyl, can be substituted for the 1, 2, 3, 4, or 5 carbon hydrogens. An excellent group of precursors are those in which a trimethylsilyl is located at the 1 and 5 carbons or methyl on carbons 2 and 4.

These complexes have a lower deposition temperature (e.g. 400° C. as compared with 650° C.) than corresponding cyclopentadienyl complexes such as ferrocene.

These organometallic complexes can be readily synthesized, e.g. as described in Ernst, Richard D. Structural and Reactivity Patterns in Transition-Metal-Pentadienyl Chemistry, 88 *Chem. Rev.* 1255–1291, 1988; Wilson, David R. et al., Pentadienyl Compounds of Vanadium, Chromium, and Manganese, 104 *J. Am. Chem. Soc'y* 1120–1122, 1982; Wilson, David R. et al., Bis-(pentadienyl) Iron Compounds: The "Open Ferrocenes", 102 *J. Am. Chem. Soc.* 5928, 1980; Cymbaluk, Teddy H. et al., The Synthesis and Characterization of Tris(2,4-Dimethylpentadienyl)-Uranium, U(2,4-$C_7H_{11}$)$_3$, 255 *J. Organometallic Chem.* 311, 1983; Stahl, Lothar, et al., Synthetic, Structural and PE Spectroscopic Studies Bis(pentadienyl) Compounds of Iron, Ruthenium and Osmium, The Role of the Heavy Metal, 326 *J. Organometallic Chem.* 257, 1987; Liu, Ju-Zheng et al., Bis(2,4-dimethylpentadienyl) Titanium: An "Open Titanocene", 104 *J. Am. Chem. Soc'y* 3737, 1982; Ernst, Richard D. et al., Synthesis, Characterization, and Solid-State Structural Determination of Tris(2,4-dimethylpentadienyl)Neodymium, Nd(2,4-$C_7H_{11}$)$_3$, 1 *Organometallics* 708, 1982; Wilson, David R. et al., Synthesis and Characterization of Bis(pentadienyl) Iron and Several Methylated Derivatives, 2 *Organometallics* 1220, 1983; Stahl, Lothar et al., Synthesis and Characterization of Bis(pentadienyl)Ruthenium Compounds, 2 *Organometallics* 1229, 1983; Ernst, Richard D., Metal-Pentadienyl Chemistry, 18 *Accounts of Chem. Research* 56 1985; Newbound, Timothy D. et al., Structural and Reaction Chemistry of the "Open Chromocene" Bis(2,4-dimethylpentadienyl)Chromium, 6 *Organometallics* 2432, 1987; Wilson, D. R. et al., Bis(2,4-dimethylpentadienyl) Complexes of the Transition Metals, 3 *Organometallic Synthesis* 136, 1986; Stahl, L. et al., 326 *J. Organometallic Chem.* 257 1987; Trakarnpruk, Wimonrat et al., Half-Open Ruthenocenes Derived From [Ru(C$_5$Me$_5$) Cl]$_4$: Synthesis Characterizations, and Solid-State Structures, 11 *Organometallics* 1686, 1992. These materials are in some cases more stable than corresponding closed metallocenes or metal cyclopentadienyls, and are available for a large number of metallic elements. Nevertheless these open metallocenes sublime readily at moderate temperatures (e.g., 125° C.) and can deposit metal through thermolytic decomposition at low enough temperatures (e.g., 400° C.) so as to avoid damage to sensitive substrates. These materials are also suitable precursors for photolytic deposition of metals.

In addition to these precursors, the process of this invention can employ metal complexes in which an oxygen is substituted for the 1 or 5 carbon in the open pentadienyl, e.g. ruthenium oxopentadienyl or a derivative, such as Ru(C$_5$Me$_5$) (2,4-OC$_6$H$_9$), or Ru(C$_5$Me$_5$)-(3,5-OC$_6$H$_9$).

The above and many other objects, features and advantages of this invention will become apparent from the ensuing detailed description of a few illustrative examples of the process according to the present invention.

DESCRIPTION OF THE PREFERRED EMBODIMENTS

In this invention, precursors based on an open pentadienyl group are flowed into a deposition chamber and are contacted with a surface of interest where metal layer is deposited. The precursor is decomposed by applying energy, e.g. heat or a laser beam, resulting in release of the metal which is then deposited on the surface. The organic residues are carried off with any carrier gases, and very little of the carbon is incorporated into the metal layer.

Organometallic precursors are heated to sublime a vapor at a suitable pressure, e.g. 0.1 Torr, and the vapors are entrained in a carrier such as hydrogen. The precursors contact a substrate, e.g. a semiconductor wafer, within the chamber. The wafer can be heated to a suitable temperature, e.g. 400° C. to effect decomposition of the organometallic material. This results in deposition of the metal component. The organic residue components are carried off in the carrier gas. In alternative process modes, the wafer or other substrate is cooled and a laser beam is focused onto selected portions of the wafer for photolytic decomposition of the precursor and deposition of the metal. This technique permits deposition onto temperature-sensitive materials.

The precursors can generally be formed by direct reaction of an open pentadienyl anion with the transition metal, e.g., in chloride form. For example, it has been found that direct reaction of two equivalents of 2,4-dimethylpentadienyl potassium with divalent titanium, vanadium, chromium or iron chloride or chloride complexes leads straightforwardly to the formation of respective so-called "open metallocenes", M(2,4-$C_7H_{11}$)$_2$ where M is Ti, V, Cr, or Fe. Products can also be isolated from reactions involving manganese or cobalt dichloride.

Stable second-row and third-row transition-metal metallocenes can also be formed, for example starting with RuCl$_3$ or Na$_2$OsCl$_6$, and reacting same with 2,4-dimethyl-1,3-pentadiene in ethanol in the presence of zinc to form Ru(2,4-$C_7H_{11}$)$_2$ or Os(2,4-$C_7H_{11}$)$_2$, respectively. The replacement of 2,4-dimethyl-1,3-pentadiene with a 2,3,4-trimethyl analog yields Ru(2,3,4-$C_8H_{13}$)$_2$ or Os(2,3,4-$C_8H_{13}$)$_2$. For open metallocenes of this type, complexes can be formed by direct coordination of a ligand L, such as CO, PF$_3$, PMe$_3$, P(OMe)$_3$ or PEt$_3$. These ligand adducts are readily formed for titanium and vanadium precursors.

Related open metallocene adducts for zirconmum, hafnium, niobium, molybdenum, and tungsten may be prepared by the following route:

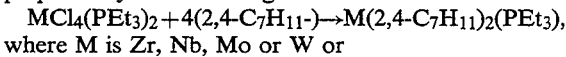

where M is Zr, Nb, Mo or W or

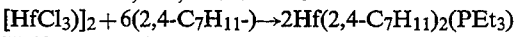

Half-open ruthenocenes can be prepared from (pentamethylcyclopentadienyl)ruthenium(II) chloride in a THF solution, with potassium carbonate, mesityl oxide or 2-methyl-2-pentenal.

From these techniques, half-open oxorutnenocenes can also be formed, namely:

Ru(C$_5$Me$_5$) (2,4-OC$_6$H$_9$) or Ru(C$_5$Me$_5$) (3,5-C$_6$H$_9$)

Ruthenium oxopentadienyl compounds can also be synthesized of the general formula

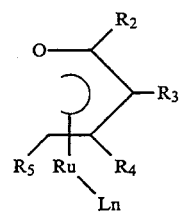

Many other precursors can be formed based on open pentadienyl groups with substituents at any of the 1, 2, 3, 4 or 5 carbon atoms, or with oxygen substituted for the 1 or 5 carbon.

The precursor components are characterized by an optimal combination of thermal stability and reactivity. These open metallocenes are stable at room temperature, with low toxicity. They also are generally crystalline, but will sublime to a significant vapor pressure upon heating, and decompose at temperatures below the decomposition temperatures of corresponding cyclic or closed metallocenes. The compounds can also decompose photolytically, employing standard laser wavelengths.

Because temperatures needed are lower than for prior techniques, the metal films have lower internal stresses, and in addition can be applied unto temperature sensitive substrates for which other decomposition techniques are unavailable or inappropriate. Both conformal coatings and selective area epitaxial coatings can be deposited by this technique.

Deposition of Fe, Cr, Ti and their respective carbides has been carried out using $Fe(C_7H_{11})_2$, $Cr(C_7H_{11})_2$ and $Ti(C_7H_{11})_2$.

In an exemplary deposition, pyrolytically deposited Fe from $Fe(C_7H_{11})_2$ was obtained on Pyrex at low pressure ($1 \times 10^{-4}$ Torr) in a CVD reactor described previously (see Glass, Jr. et al., 4 Chem. Mat. 530, 1992). Deposition was conducted for six hours. The $Fe(C_7H_{11})_2$ material was maintained at 25° C. and the substrate was maintained between 452°–462° C. Analysis of a representative film indicates 80.6% Fe, and 7.8% C, by weight which corresponds to an empirical formula of $Fe_2C$. The amorphous film was deposited at a rate of 114 Å per minute, based on Auger analysis.

Pyrolytic deposition of Cr from $Cr(C_7H_{11})_2$ was completed on silicon (111) while maintaining the temperature of the substrate between 441° C. and 534° C., with a source temperature of 50° C. Analysis of a representative film via SEM and XRD indicated polycrystalline $Cr_3C_2$ and oxidized Cr in the form of $Cr_2O_3$. Both $Cr_3O_2$ and $Cr_3C_2$ were in preferred orientations. Annealing of this $Cr_3C_2$ film for twelve hours at 650° C. and then for seven hours at 850° C. resulted in a more random orientation of the $Cr_3C_2$. Orientation of the $Cr_2O_3$ remained unchanged.

Deposition of Ti on silicon (111) from the pyrolysis of $Ti(C_7H_{11})_2$ was conducted at substrate temperatures from 533° C. to 706° C. and with source temperatures between 50° C. and 80° C. Analysis of the resulting film via SEM and XRD showed titanium in small amounts and only amorphous material in the film. Low amounts of $H_2$ gas passed through with the source increased the Ti concentration but did not change the amorphous nature of the film. Increased doses of $H_2$ increase the Ti concentration.

It is remarkable that the carbon incorporation in these films is only about half of the carbon incorporation that is experienced using closed-metallocene (i.e., $M(C_5H_5)_2$) precursors. Also, with this technique the substrate temperatures can be kept at much lower temperatures than with film deposition using corresponding closed pentadienyl chemistry.

Metal film deposition has also been conducted under conditions similar to these described above, using 1-oxo open pentadienyl precursors, i.e.,

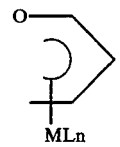

In these films the carbon incorporation has been found to be significantly reduced over the previous examples, although full Auger data are not yet available.

Deposition of ruthenium has been carried out, using the precursors described previously including ruthenium oxopentadienyl and derivatives, with good results as to carbon incorporation and uniformity of coating. The deposition conditions are substantially the same as those previously described for titanium, chromium and iron.

It has been found that various substituents, e.g. alkyl, halogenated lower alkyl, or alkylated silk can be substituted for the hydrogen at any of the 1, 2, 3, 4 or 5 carbons of the open pentadienyl, or at the 2, 3, 4, or 5 carbons of the open oxodienyl with favorable results. Also rather than having ligands that consist only of pentadienyl, additional ligands can be any neutral donor ligand, e.g. phosphine or carbonyl.

It has also been found that photolytic techniques can be employed to carry out selective deposition. A highly focused laser beam, of a conventional infrared wavelength, can be employed for pattern deposition on a substrate. In this case, the substrate is unheated or cooled, or can be heated to a temperature below the precursor decomposition temperature, so that the laser beam supplies the energy to decompose the material for deposition of the film.

Suitable precursors can also be formed of pentadienyl complexes of metals from the lanthanum series (elements 57 to 71) or the actinium series (elements 89 to 103), and in particular Nd or U.

While the invention has been described with reference to several illustrative examples, the invention is certainly not limited only to those examples. Rather, many modifications and variations will present themselves to those of skill in the art without departing from the scope and spirit of the invention, as defined in the appended claims.

What is claimed is:

1. Chemical vapor deposition process for depositing a metal film upon a substrate comprising contacting said substrate with a vapor of a precursor of the general formula

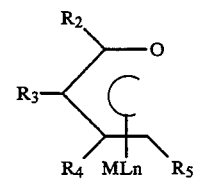

where M is a nonferrous metallic element;
Ln is one or more additional ligands;
$R_1$, $R_2$, $R_3$, $R_4$ and $R_5$ are substituents selected from the group consisting of hydrogen, lower alkyl, halogenated lower alkyl, alkylated silyl and siloxy; and thermally or photolytically decomposing said precursor in contact with the substrate with sufficient energy to bring about deposition of a film of the metallic element.

2. The chemical vapor deposition process of claim 1, where said $R_1$ and $R_5$ are trimethylsily.

3. The chemical vapor deposition process of claim 1, wherein said precursor is $M(2,4-C_7H_{11})_2$, where M is selected from the group consisting of Ti, V, Cr, Ru, and Os.

4. The chemical vapor deposition process of claim 1 wherein said precursor is $M(1,5-(Me_3Si)_2C_5H_5)_2$, where M is selected from the group consisting of Ti and Zr.

5. The chemical vapor deposition process of claim 1 where said precursor is $M(2,4-C_7H_{11})_2$ (L), where M is selected from the group consisting of Hf, Nb, Mo, W, Zr, V, and Ti, and L is a neutral donor ligand selected from the group consisting of phosphine and carbonyl.

6. The chemical vapor deposition process claim 1, wherein said decomposing is carried out photolytically by directing a laser beam onto selected locations on said substrate.

7. The chemical vapor deposition process of claim 1 wherein said contacting includes subliming said precursor to form said vapor thereof, and flowing said vapor past said substrate.

8. Chemical vapor deposition process for depositing a metal film upon a substrate, comprising
contacting said substrate with a vapor of a precursor of the general formula

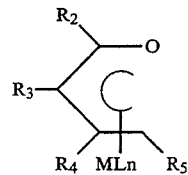

where M is a metallic element;
Ln is one or more additional ligands; and
$R_2$, $R_3$, $R_4$ and $R_5$ are selected from the group that consists of hydrogen, lower alkyls, halogenated lower alkyls, silyls and alkylated silyl; and
thermally or photolytically decomposing said precursor at predetermined locations where said precursor contacts the substrate to bring about deposition of the metallic element.

9. Chemical vapor deposition process according to claim 8 wherein said metal M is a transition metal.

10. Chemical vapor deposition process according to claim 9 wherein said metal M is a Group IV B to VIII B transition metal.

11. Chemical vapor deposition according to claim 10 wherein said metal is a Group VIII B transition metal.

12. Chemical vapor deposition process according to claim 8, wherein said precursor is a methylated ruthenium bis-(oxopentadienyl).

13. Chemical vapor deposition process according to claim 1, wherein said metallic element is selected from the metals in the lanthanum and actinium series.

* * * * *